United States Patent
Price et al.

(10) Patent No.: US 11,899,065 B2
(45) Date of Patent: Feb. 13, 2024

(54) SYSTEM AND METHOD TO WEIGHT DEFECTS WITH CO-LOCATED MODELED FAULTS

(71) Applicant: KLA Corporation, Milpitas, CA (US)

(72) Inventors: David W. Price, Austin, TX (US); Robert J. Rathert, Mechanicsville, VA (US); Chet V. Lenox, Lexington, TX (US); Oreste Donzella, San Ramon, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/889,491

(22) Filed: Aug. 17, 2022

(65) Prior Publication Data

US 2023/0280399 A1    Sep. 7, 2023

Related U.S. Application Data

(60) Provisional application No. 63/315,098, filed on Mar. 1, 2022.

(51) Int. Cl.
| | |
|---|---|
| *G06F 30/30* | (2020.01) |
| *G01R 31/3183* | (2006.01) |
| *G01R 31/3177* | (2006.01) |

(52) U.S. Cl.
CPC ... *G01R 31/31835* (2013.01); *G01R 31/3177* (2013.01); *G01R 31/318314* (2013.01)

(58) Field of Classification Search
CPC .......... G01R 31/31835; G01R 31/3177; G01R 31/318314
See application file for complete search history.

(56) References Cited

U.S. PATENT DOCUMENTS 10,024,910 B2 *   7/2018   Kusko .............. G01R 31/31835
10,761,128 B2     9/2020   Price et al.
(Continued)

FOREIGN PATENT DOCUMENTS

JP    2003329611 A    11/2003

OTHER PUBLICATIONS

Lin et al., "Physically-Aware N-Detect Test Pattern Selection", Proceedings of the conference on Design, automation and test in Europe, Association for Computing Machinery New York NY United States, Mar. 10, 2008 (Year: 2008).*
(Continued)

*Primary Examiner* — Jack Chiang
*Assistant Examiner* — Brandon Bowers
(74) *Attorney, Agent, or Firm* — Suiter Swantz pc llo

(57) ABSTRACT

Systems and methods for generating defect criticality are disclosed. Such systems and methods may include identifying defect results including a defect and a defect location. Such systems and methods may include receiving fault test recipes configured to test potential faults at a plurality of testing locations. Such systems and methods may include identifying a plurality of N-detect parameters based on a countable number of times the fault test recipes are configured to test a potential fault. Such systems and methods may include determining a plurality of weighting parameters based on the plurality of N-detect parameters. Such systems and methods may include generating the defect criticality for the defect based on a proximity between the plurality of testing locations and the defect location and the plurality of weighting.

32 Claims, 11 Drawing Sheets

(56) References Cited

U.S. PATENT DOCUMENTS

| | | |
|---|---|---|
| 17,364,221 | 6/2021 | Price |
| 11,614,480 B2 | 3/2023 | Price et al. |
| 2004/0004482 A1 | 1/2004 | Bouabdo et al. |
| 2004/0032280 A1 | 2/2004 | Clark et al. |
| 2008/0172190 A1 | 7/2008 | Lee |
| 2009/0257645 A1 | 10/2009 | Chen et al. |

OTHER PUBLICATIONS

Swanson, B., "Design for test boot camp, part 3: advanced fault models and cell aware tests." https://www.edn.com/design-for-test-boot-camp-part-3-advanced-fault-models-and-cell-aware-test/.

Venkataraman, et al (Intel Corporation). "An Experimental Study of N-Detect Scan ATPG Patterns on a Processor." Proceedings of the 22nd IEEE VLSI Test Symposium, 2004.

Korean Intellectual Property Office, International Search Report and Written Opinion for International Application No. PCT/US2023/013548, dated Jun. 16, 2023, 7 pages.

\* cited by examiner

SYSTEM AND METHOD TO WEIGHT DEFECTS WITH CO-LOCATED MODELED FAULTS

CROSS-REFERENCE TO RELATED APPLICATION

The present application claims the benefit under 35 U.S.C. § 119(e) of U.S. Provisional Application Ser. No. 63/315,098, filed on Mar. 1, 2022, entitled "System for Statistical Detection of Semiconductor Reliability Failures Using the N-Detect Parameter from ATPG Test Patterns to Weight Co-Located Defectivity," which is incorporated herein by reference in the entirety.

TECHNICAL FIELD

The present disclosure relates generally to die screening systems, and, more particularly, to weighting defects for purposes of screening dies.

BACKGROUND

Risk averse users of semiconductor devices, such as automotive, military, aeronautical, and medical applications, need failure rates in the Parts per Billion (PPB) range, well below typical rates. Recognizing and screening out devices that fail is key to meeting these industry requirements.

In the course of manufacturing a semiconductor device, a wafer goes through hundreds of processing steps to pattern a functioning device. Over the course of these steps, inspection and metrology steps are performed to ensure the process is within control limits and will produce a functioning product at the end of the manufacturing cycle. Inspection systems may find unintended defects in the patterned structures of the devices, while metrology systems may measure the physical parameters of features of the device (e.g., film thickness, patterns, overlay, etc.) versus the intended physical parameters. Electrical test-based systems (e.g., electric probes) may also be used to test for defects by testing for proper electrical function of a device.

Test-based die screening techniques are often based on a fault model. For example, a fault model may test for the expected response of a circuit when a defect is present. Automatic Test Pattern Generation (ATPG) software utilizes various fault models to generate electrical testing recipes (e.g., testing patterns, inputs, and the like) that can test for the presence of potential faults.

A "stuck-at" fault model is a particular fault model used by fault simulators and ATPG sub-systems to mimic a manufacturing defect within an integrated circuit. Individual signals and pins are assumed to be stuck at Logical '1', '0' and 'X'. For example, an input is tied to a logical 1 state during test generation to assure that a manufacturing defect with that type of behavior can be found with a specific test pattern. Likewise, the input could be tied to a logical 0 to model the behavior of a defective circuit that cannot switch its output pin. However, not all faults can necessarily be analyzed using the stuck-at fault model. Therefore, other fault models are often used to supplement stuck-at fault models. Fault models may test for a specific potential fault multiple times using various test patterns. However, testing for every possible potential fault is generally cost prohibitive because—while some test patterns can simultaneously test for many faults—the number of tests needed increases exponentially as the test coverage (i.e., number of possible faults tested for) approaches 100 percent. Further, some faults may be impossible (e.g., deterministically impossible) to test for due to the logic layout. ATPG software and operators generally find a balance that limits the number of tests to be performed to a reasonable number, where some potential faults are tested for many (e.g., 5, 10, 100s) times while others may only be tested once or not at all.

A challenge of increasing reliability is that a relatively large percentage of reliability failures of samples that make it to the supply chain are due to test escape defects. For example, one definition of test escape defects are defects that are detected (e.g., optically imaged) but the sample somehow (e.g., due to test coverage gaps) still passes all tests and the defects are mistakenly identified as being harmless. As mentioned above, screening out these failures by increasing test coverage could become prohibitively expensive and impractical. Therein lies a desire to more accurately screen samples and cure the deficiencies above.

SUMMARY

A screening system for generating defect criticality is disclosed, in accordance with one or more embodiments of the present disclosure. In one illustrative embodiment, the screening system includes a controller communicatively coupled to one or more sample analysis sub-systems. In another illustrative embodiment, the controller includes one or more processors and may include memory. In another illustrative embodiment, the one or more processors are configured execute a set of program instructions stored on the memory. In another illustrative embodiment, the one or more processors are configured to execute program instructions causing the one or more processors to identify defect results including a defect and a defect location of the defect. In another illustrative embodiment, the one or more processors are configured to execute program instructions causing the one or more processors to receive fault test recipes, where each fault test recipe is configured to test one or more of a plurality of potential faults at a plurality of testing locations. In another illustrative embodiment, the one or more processors are configured to execute program instructions causing the one or more processors to identify a plurality of N-detect parameters, where each N-detect parameter of the plurality of N-detect parameters is associated with a testing location of a potential fault of the plurality of potential faults and is based on a countable number of times the fault test recipes are configured to test the potential fault. In another illustrative embodiment, the one or more processors are configured to execute program instructions causing the one or more processors to determine a plurality of weighting parameters based on the plurality of N-detect parameters, where the plurality of weighting parameters are associated with the plurality of testing locations. In another illustrative embodiment, the one or more processors are configured to execute program instructions causing the one or more processors to generate the defect criticality for the defect based on at least: a proximity between the plurality of testing locations of the plurality of potential faults and the defect location of the defect; and the plurality of weighting parameters associated with the plurality of testing locations.

A method is disclosed, in accordance with one or more embodiments of the present disclosure. In one illustrative embodiment, the method may include, but is not limited to, identifying defect results including a defect and a defect location of the defect. In another illustrative embodiment, the method may include receiving fault test recipes, where each fault test recipe is configured to test one or more of a plurality of potential faults at a plurality of testing locations. In another illustrative embodiment, the method may include identifying a plurality of N-detect parameters, where each N-detect parameter of the plurality of N-detect parameters is associated with a testing location of a potential fault of the plurality of potential faults and is based on a countable number of times the fault test recipes are configured to test the potential fault. In another illustrative embodiment, the method may include determining a plurality of weighting parameters based on the plurality of N-detect parameters, where the plurality of weighting parameters are associated with the plurality of testing locations. In another illustrative embodiment, the method may include generating the defect criticality for the defect based on at least: a proximity between the plurality of testing locations of the plurality of potential faults and the defect location of the defect; and the plurality of weighting parameters associated with the plurality of testing locations.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

Figure 1:
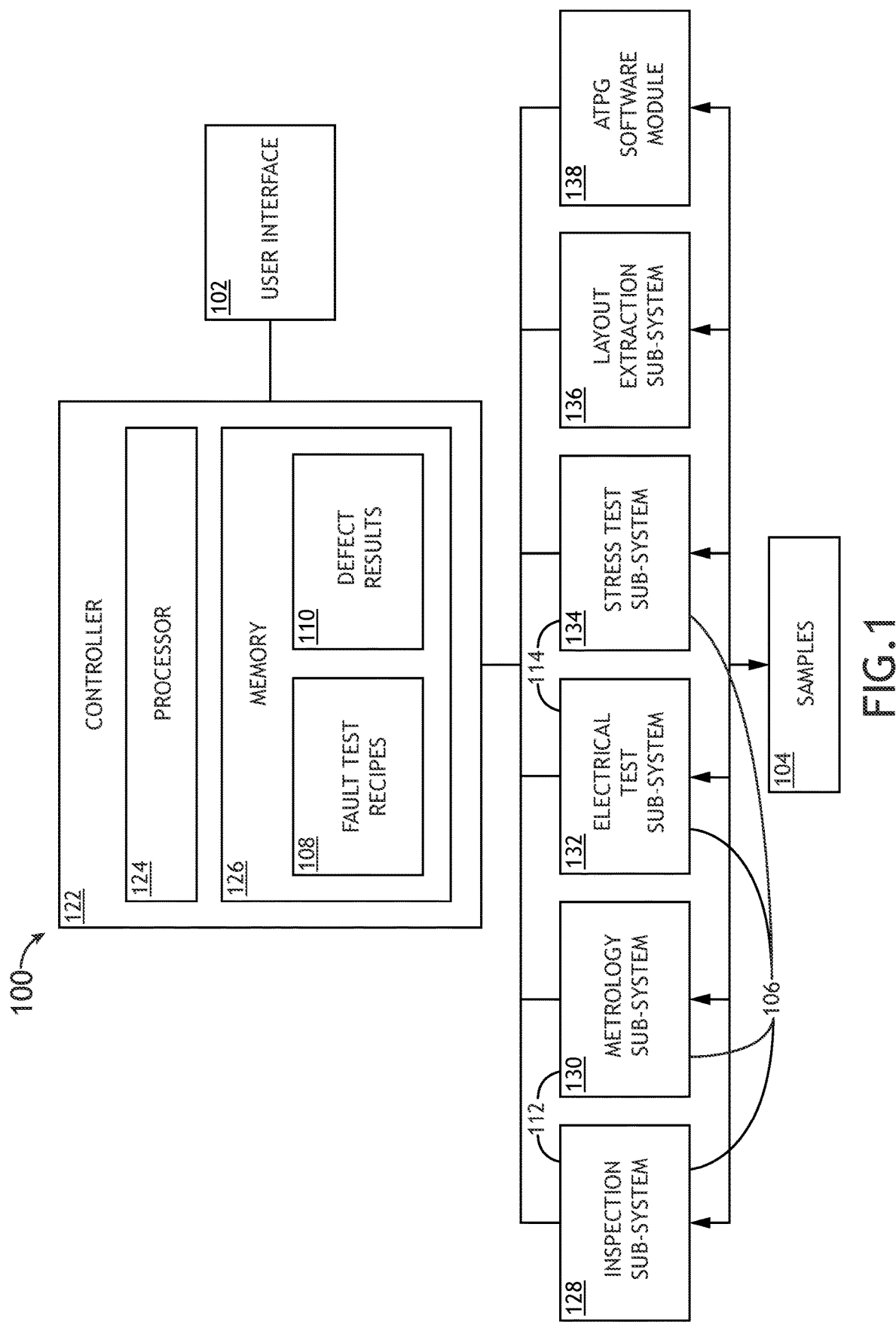
FIG. 1 illustrates a block diagram view of a screening system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to generating a defect criticality for a defect using an N-detect parameter. For example, embodiments of the present disclosure are directed to determining how likely a defect is to be a test escape defect (e.g., killer defect that somehow passes some or all electrical tests) based on 1) the proximity of the defect to testing locations of the electrical tests and 2) how many times those testing locations are tested.

It is contemplated herein that a correlation may exist between the N-detect parameter (i.e., countable number of tests performed for a particular fault/location) and a defect criticality of a nearby defect. It may be difficult to determine whether a defect is going to cause a fault using only non-test-based inspection methods (e.g., imaging). Defects, if they cause a fault at all, tend to do so near the defect. For example, a defect between two features may cause a short circuit fault between those features. The more times a fault is tested for and passes the tests, the less likely that particular fault exists. Similarly, if many faults are tested for in an area many times, it is less likely that any fault exists in that area at all. If no fault exists in an area, and defects tend to cause faults near the defect, then it follows that a defect in such an area is, all else being equal, less likely a fault-causing (i.e., killer) defect. Rather, a defect near relatively highly-tested areas is more likely to be a harmless nuisance defect. Conversely, defects near areas that are less tested, and thus have lower N-detect parameter values, are more ambiguous as to whether they may be killer defects. Therefore, it is contemplated that defects in (or near) such lower-tested areas should be paid closer attention to and/or weighted more heavily by increasing the defect criticality associated with such defects.

Such a correlation between the N-detect parameter and the proximity of a defect may be used to reduce overkill and underkill in a screening process, improving customer satisfaction and lowering costs. Some embodiments may augment existing defect weighting/screening techniques by further adding an N-detect parameter as a consideration when weighing defects for die screening purposes. In one example, if there are many defects on a die with high defect criticality, such a die may be screened out of the supply chain.

The N-detect parameter weighting approach applies to both stuck-at and transition delay testing. These are efficient test methods and are almost universally applied as the foundation to any test plan. When very high coverage is needed, advanced fault models are sometimes layered on top of these. For the purposes of the present disclosure, the N-detect parameter approach may be extended to advanced fault models such as Deterministic Bridging and Cell-Aware by noting that for these cases N-detect parameter may be equal to 1 since they are inherently based on physically-aware fault modeling concepts.

There are many methods of defect weighting. However, unlike embodiments of the present disclosure, other methods of defect weighting do not seek to weigh defectivity based on test parameters at the fault level. Some defect weighting methods rely on weighting defects exclusively on defect attributes. For example, inspection sub-systems may be used to image the defect and generate parameters such as defect size, shape, background information, polarity, and many other attributes to be used to weight a defect. Other defect weighting methods keep track of the X direction and Y direction coordinates of the defects. Such defect locations may be accompanied, for example, by manually drawn relatively large bounding boxes around functional blocks of the device to aide in weighting the defect. One example is macroscopic bounding boxes to exclude or reduce consideration of defects occurring in open areas of the device which do not contain critical circuitry. Defects that occur in these areas may, in such methods, be given a low or zero weight value. In another example, macroscopic bounding boxes are utilized to preferentially weight critical blocks of the circuit. Defects that occur in these areas may be given a high weight value. In another example, macroscopic bounding boxes are utilized to preferentially weight large functional blocks of the circuit that are unusually difficult to test. For example, defects that occur in the analog section of the circuit may be given a higher weight value. Other defect weighting methods include contextual information related to the defect location (e.g., coordinates) based on design layout information associated with design rule marginalities. These precise (e.g., sub-micron precision) care areas are commonly used by advanced defect inspection systems (e.g., Nano-point, Pin-point, and Pixel-point). However, these other defect weighing methods do not seek to weigh defectivity based on test parameters at the fault level in accordance with one or more embodiments of the present disclosure.

For the purposes of the present disclosure, the term "faults" and the like generally encompass modeled "potential" faults that may or may not exist. Various faults can be tested for including, but not limited to, short faults (e.g., short circuits), open faults, and stuck-at faults. In some cases, it is possible to deterministically test for faults. However, due to various constraints (e.g., complexity of the circuit, testing time/cost constraints, and the like) some faults are only probabilistically tested for such that the results of the test indicate a probability of faults existing. To increase the chances of detecting faults, many test patterns of various fault models may each probabilistically test for many faults simultaneously such that at least some faults are probabilistically tested for multiple times.

For example, a short circuit fault at a particular location between two features of a sample may be tested for any number of times (e.g., 1, 2, 3, 4, 5, 8, 15, 30, 50, 100, 300, or more times) according to a set of fault test recipes that includes many test patterns. For purposes of the present disclosure, the countable number of times a potential fault (and/or a testing location associated with such a fault) is tested (or is configured to be tested) using a set of fault test recipes is, unless otherwise noted, an "N-detect" parameter.

Defects arising during the manufacturing process may have a wide range of impacts on the performance of the device in the field. A killer defect is a defect causing a fault in the electrical functionality of the sample such that the sample is not fit to enter the supply chain while a nuisance defect has little to no effect (i.e., is fit to enter the supply chain). For example, "killer" defects occurring in known or unknown locations within designs may result in immediate device failure. For instance, killer defects in unknown locations may be particularly problematic where they have a susceptibility to reliability escapes in test gaps, where a semiconductor device may be functionally dead after processing but the device maker is unable to make this determination due to limitations in testing. By way of another example, minor defects may have little or no impact on the performance of the device throughout the device lifetime. By way of another example, a class of defects known as latent reliability defects (LRD) may not lead to failure during manufacturing/testing or may not lead to immediate device failure during operation, but may lead to early-life failure of the device during operation when used in a working environment. It is noted herein the terms "manufacturing process" and "fabrication process" may be considered equivalent, along with respective variants of the terms (e.g., "manufacturing line" and "fabrication line", and the like), for purposes of the present disclosure.

A correlation between N-detect parameters and LRD does not necessarily exist because, by at least one definition, LRD do not cause a failure of any tests. Rather, LRD cause a fault in the future. In this regard, increasing the number of tests that are passed for an area would not necessarily decrease the likelihood that nearby defects are not LRD. Defect characterization techniques using characteristics such as defect size, shape, and the like without consideration for N-detect parameters at the fault level may be better suited for identifying LRDs.

If a defect is misclassified as a nuisance defect, then a test escape die may enter the supply chain in an under-kill, false-negative scenario. Conversely, if a nuisance defect is misclassified as a killer defect and removed from the supply chain then the fabrication process incurs unnecessary yield loss in an overkill, false-positive scenario.

Generally, samples with defects may be screened out of the supply chain using one or more of a variety of techniques of a screening system.

Since reliability is often a statistical phenomenon, rather than deterministic, it is very difficult to reliably characterize defects as 'killer' or 'non-killer'/nuisance. Rather, engineers may employ a statistical weighting system—the higher the weighting (e.g., defect criticality) given to a specific defect, the higher the probability of that defect causing a reliability failure.

Various reliability screening methods may be utilized, such as inline characterization methods (e.g., inline defect inspection methods) or test methods (e.g., electrical test methods). In a general sense, inline characterization methods that generate defect results may be image-based, but test methods that generate test results are not generally image-based and may be test-based.

Inline defect screening techniques may be particularly useful to improve reliability of samples. For example, inline part average testing (I-PAT) defect classifiers may be used to detect/characterize defects and determine binning attributes as disclosed in U.S. Pat. No. 10,761,128, filed on Apr. 5, 2017, entitled "Methods and Systems for Inline Parts Average Testing and Latent Reliability Defect Detection", which is hereby incorporated by reference in its entirety.

In addition to imaging defects to screen out unreliable samples, there are various test-based methods such as, but not limited to, using electric test probes, automatic test equipment, and the like to test for proper electrical functionality of devices (e.g., circuits, logic gates, etc.). In embodiments, tests may include, but are not limited to, post-packaging tests (e.g., unit probe tests, class probe tests), burn-in tests, tests performed after fabrication processes (e.g., electrical wafer sort), and/or other quality checks (e.g., final tests).

FIG. 1 illustrates a block diagram view of a screening system 100, in accordance with one or more embodiments of the present disclosure. In embodiments, the screening system 100 includes one or more sample analysis sub-systems 106. In embodiments, the one or more sample analysis sub-systems 106 include one or more characterization sub-systems 112 and one or more test sub-systems 114. A characterization sub-system 112 may include, but is not limited to, an inspection sub-system 128 and/or a metrology sub-system 130. A test sub-system 114 may include, but is not limited to, an electrical test sub-system 132 and/or a stress test sub-system 134. In embodiments, the screening system 100 includes a controller 122 including one or more processors 124, a memory 126, and a user interface 102. In embodiments, fault test recipes 108 are received by the controller 122 and stored on memory 126. The test sub-systems 114 may be configured to generate test results based on the fault test recipes 108. In embodiments, defect results 110 are generated using the one or more characterization sub-systems 112, are stored on memory 126, and include defects and defect locations. The one or more sample analysis sub-systems 106 may further include a layout extraction sub-system 136 and/or an ATPG software module 138. For example, an ATPG software module 138 may be used to generate fault test recipes 108 and a layout extraction sub-system 136 may be used to generate layout maps of features of a sample 104.

The screening system 100 may be configured to screen a population of samples 104. In embodiments, the samples 104 may be a single die in a sample, dies in a sample, dies in multiple samples in a lot, or dies in multiple samples in multiple lots.

For the purposes of the present disclosure, the term "defect" may refer to a physical defect found by an inline inspection sub-system, a metrology measurement outlier, or other physical characteristic of the semiconductor device that is deemed to be an anomaly. A defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 104 such as, but not limited to, a scratch, or a chip. For instance, a severity of the defect (e.g., the length of a scratch, the depth of a pit, measured magnitude or polarity of the defect, or the like) may be of importance and taken into consideration to weight the defect. By way of another example, a defect may include a foreign particle introduced to the sample 104. By way of another example, a defect may be a misaligned and/or mis-joined package component on the sample 104. Accordingly, it is to be understood that examples of defects in the present disclosure are provided solely for illustrative purposes and should not be interpreted as limiting.

The inspection sub-system 128 of the screening system 100 may include any inspection sub-system known in the art. For example, the inspection sub-system 128 may include an optical inspection sub-system configured to detect defects based on interrogation of the sample 104 with light from any source such as, but not limited to, a laser source, a lamp source, an x-ray source, or a broadband plasma source. By way of another example, the inspection sub-system 128 may include a particle-beam inspection sub-system configured to detect defects based on interrogation of the sample with one or more particle beams such as, but not limited to, an electron beam, an ion beam, or a neutral particle beam. For instance, the inspection sub-system 128 may include a transmission electron microscope (TEM) or a scanning electron microscope (SEM). For purposes of the present disclosure, the inspection sub-system 128 may be a single inspection sub-system or may represent a group of inspection sub-systems.

The metrology sub-system 130 may include any metrology sub-system known in the art. In embodiments, the metrology sub-system 130 is configured to characterize properties such as, but not limited to, layer thickness, layer composition, critical dimension (CD), overlay, or lithographic processing parameters (e.g., intensity or dose of illumination during a lithographic step). In this regard, a metrology sub-system 130 may provide information about the fabrication of the sample 104, one or more layers of the sample 104, or one or more semiconductor dies of the sample 104 that may be relevant to the probability of manufacturing defects that may lead to reliability issues for the resulting fabricated devices. For purposes of the present disclosure, the metrology sub-system 130 may be a single metrology sub-system 130 or may represent a group of metrology sub-systems 130.

Figure 2A:
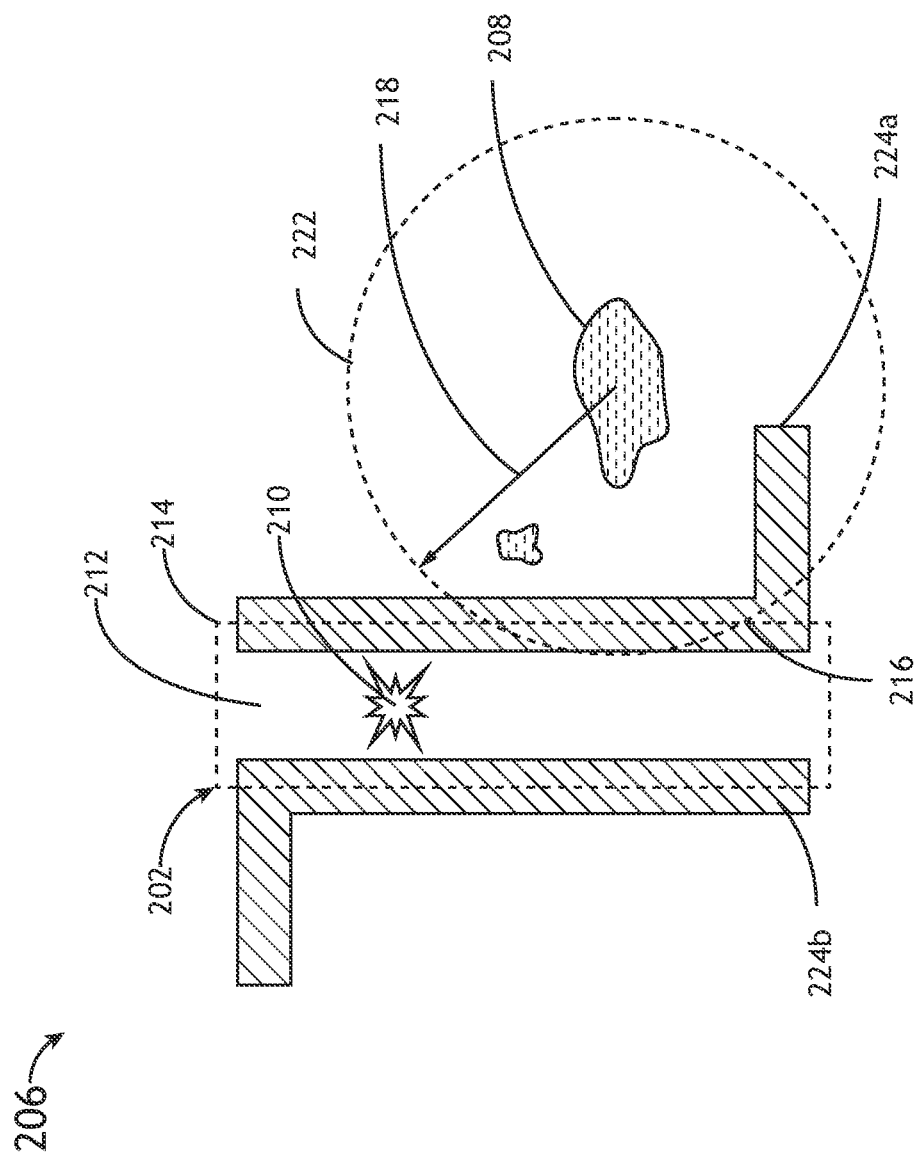
FIG. 2A illustrates a conceptual view of a layout map including features and potential faults, in accordance with one or more embodiments of the present disclosure.
Figure 2B:
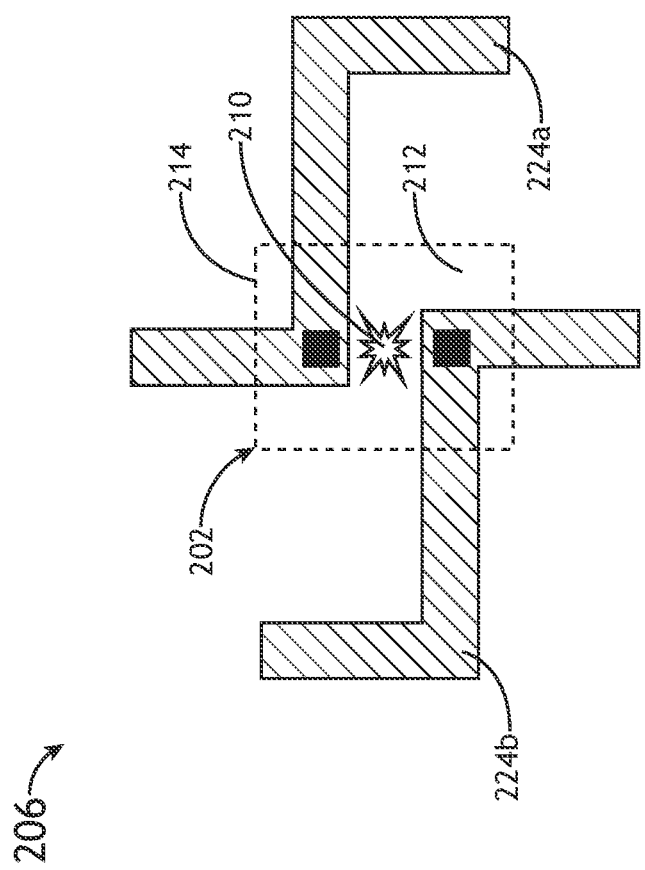
FIG. 2B illustrates a conceptual view of a layout map including features and potential faults, in accordance with one or more embodiments of the present disclosure.
Figure 2C:
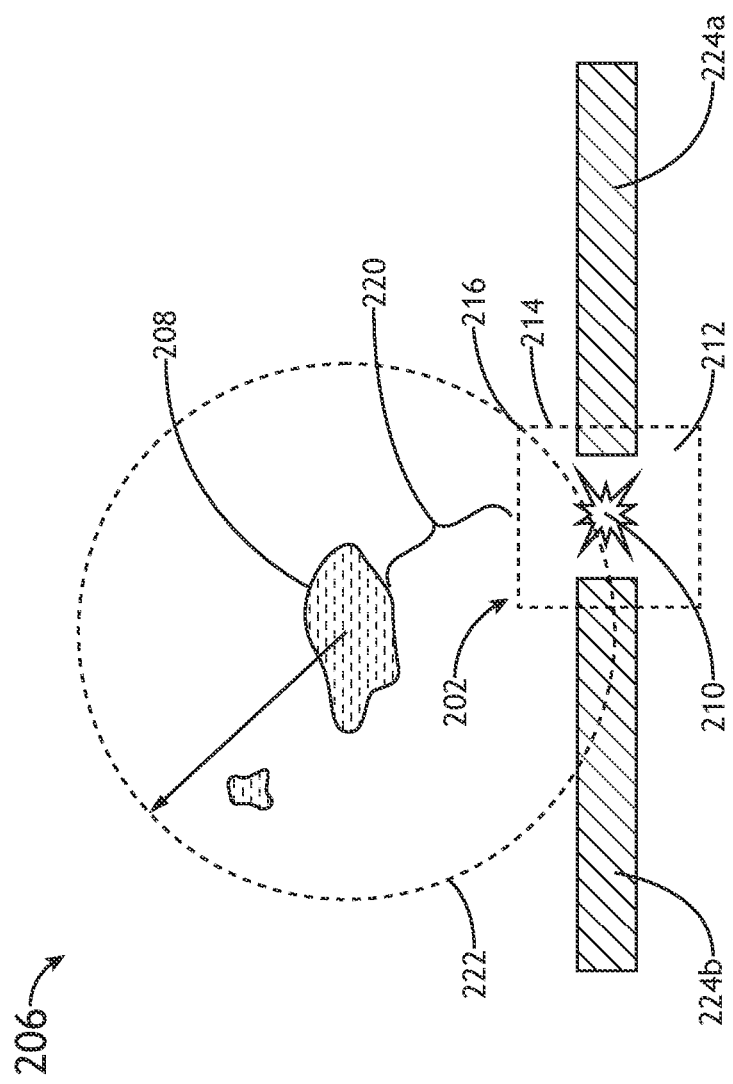
FIG. 2C illustrates a conceptual view of a layout map including features and potential faults, in accordance with one or more embodiments of the present disclosure.

FIG. 2A illustrates a conceptual view of a layout map 206 of a sample 104 including a defect 208, a potential fault 210, and features 224a, 224b, in accordance with one or more embodiments of the present disclosure. In embodiments, a testing location 202 may be associated with each potential fault 210. In embodiments, a testing location 202 includes a testing location area 212 and a boundary 214. FIGS. 2B and 2C illustrate additional conceptual views of layout maps 206 of a sample 104 including defects 208, potential faults 210, and features 224a, 224b, in accordance with one or more embodiments of the present disclosure.

Although FIGS. 2A-2C depict a specific set of attributes, quantities, types, locations, shapes, configurations, arrangements, and the like of defects 208, testing locations 202, and faults 210 of a layout map 206, it is noted that FIGS. 2A-2C are provided merely for illustrative purposes and should not be construed as limiting the scope of the present disclosure. For example, in embodiments, a testing location 202 does not necessarily include an area or boundary 214 and may be a point-based location of a fault 210 such as 2-dimensional coordinates of a single point (e.g., center point of a potential fault 210). In another example, a boundary 214 may be any shape such as circular, irregular, or the like. In another example, a layout map 206 may be 3-dimensional across multiple layers of a sample 104 and, for example, boundaries 214 and defects 208 may be 3-dimensional.

A challenge of screening samples 104 is identifying which defects 208 are killer defects that cause a fault 210. In embodiments, defects 208 are weighted with an associated defect criticality metric that is based on nearby test parameters at the fault level rather than, for example, the total number of tests performed for an entire die. For example, defect criticality may be based on test parameters such as N-detect parameters associated with nearby testing locations 202. For instance, a defect criticality of a defect 208 may be generated based on a proximity 220 (as shown in FIG. 2C) between a defect 208 and testing locations 202, as well as the N-detect parameters associated with such testing locations 202.

Figure 3:
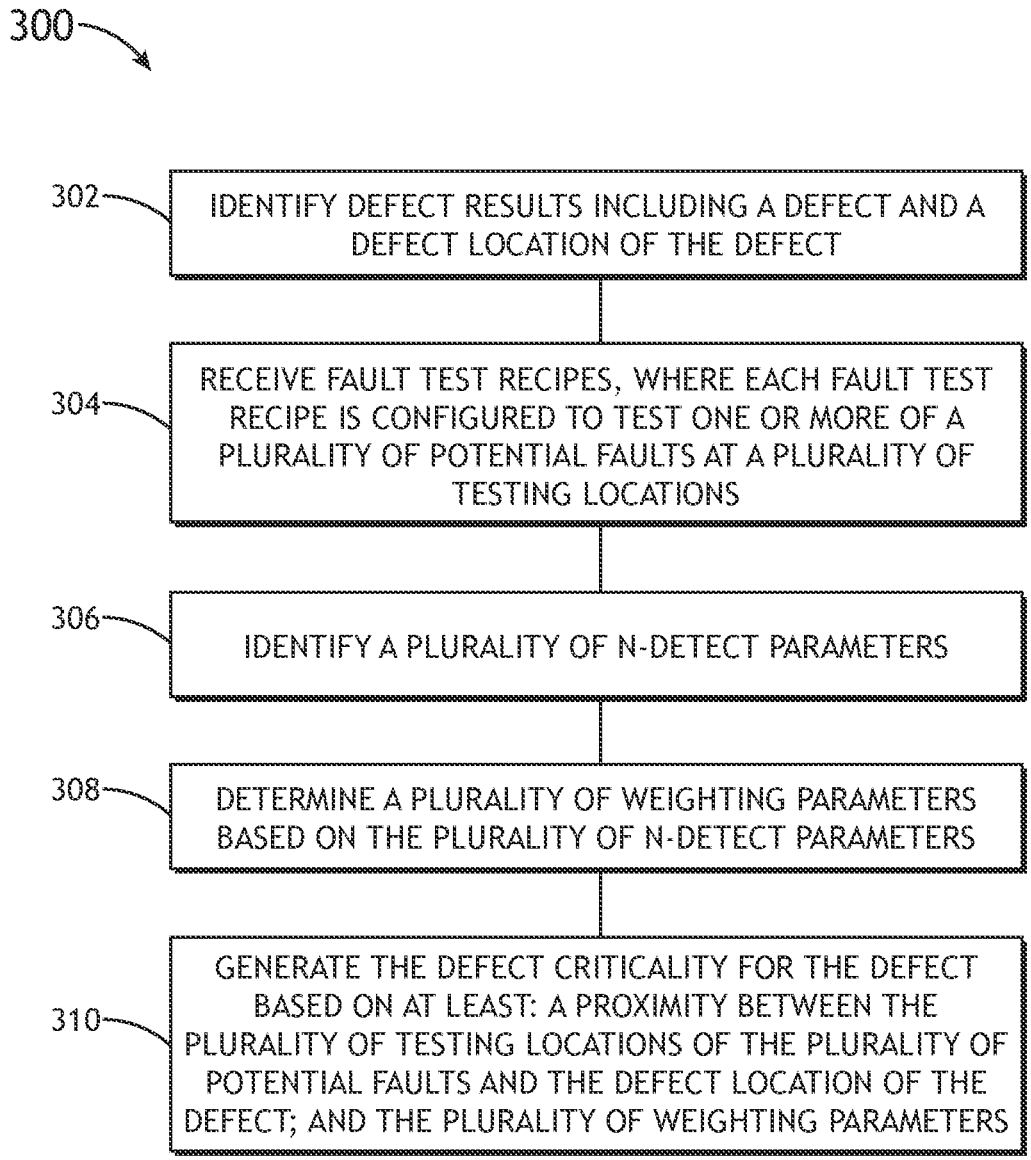
FIG. 3 illustrates a flow diagram depicting a method for generating a defect criticality of a defect, in accordance with one or more embodiments of the present disclosure.

FIG. 3 illustrates a flow diagram depicting a method 300 for generating a defect criticality of a defect 208, in accordance with one or more embodiments of the present disclosure.

In a step 302, defect results 110 may be identified (e.g., determined, received, acquired, generated, and the like). Defects may be identified using any characterization system known in the art. For example, the controller 122 may identify defect results 110 for a population of dies 104 based on inline characterization sub-system data received from an inline characterization sub-system 112 of the one or more sample analysis sub-systems 106 of the screening system 100. For example, the defect results 110 may include a defect 208 and a defect location.

In a step 304, fault test recipes 108 are received. For example, fault test recipes 108 may be received from an external source and stored on memory 126, generated on an ATPG software module 138 of a sub-system and stored on memory 126, and the like. For instance, fault test recipes 108 may be generated and received from an ATPG software module 138 of FIG. 1 based on various fault models.

In embodiments, each fault test recipe 108 is a test pattern configured to test for one or more of a plurality of potential faults 210 at a plurality of testing locations 202. For example, the fault test recipes 108 may be a set of (i.e., plurality of) fault test recipes 108 of a single test program that is specifically generated for a particular type of sample 104.

In embodiments, fault test recipes 108 are based on at least one of the following types of fault models: stuck-at fault model, transition-delay fault model, cell-aware fault model, deterministic bridging fault model, and/or any other fault model that a N-detect parameter value could be applied to.

In a step 306, a plurality of N-detect parameters are identified. N-detect parameters may be identified (e.g., generated, received, and the like) using any method disclosed herein or known in the art.

For example, an ATPG software module 138 may be configured to output the N-detect parameters as a matter of course of generating the fault test recipes 108. In this regard, identifying may simply be receiving the fault test recipes 108 that includes such N-detect parameters. However, identifying N-detect parameters is not limited to such examples and in some examples, some N-detect parameters may need to be determined/calculated/generated. In embodiments, N-detect parameters may, in embodiments, be determined based on design data of the sample 104 and the received fault test recipes 108. For example, the fault test recipes 108 may indicate which features or types of faults are being tested by which fault test recipe 108. In this regard, a processor 124 may be used to count how many times each fault 210, testing location 202, feature, or the like is tested and store such data in a table on memory 126. For example, the final count of the number of times a particular fault 210 is tested may be "identified" as a particular N-detect parameter of a plurality of N-detect parameters.

In embodiments, descriptions to a particular term or element are nonlimiting and may generally apply to other terms and elements associated with that term or element. In this regard, elements and terms may be associated with each other such that a reference to one may also mean reference to another. For example, a fault 210 may be associated with two features 224a, 224b, an N-detect parameter, a weighting parameter, a testing location 202, a testing location area 212, a boundary 214, and the like. Further, each associated element may be cross-associated with every other associated element. For purposes of the present disclosure, the term "associated" and the like means related to, based on, paired with, and/or the like. For example, each fault 210 may be "paired" with a respective testing location 202. The multiple associations and cross-associations of these terms and elements may be difficult to concisely describe for all embodiments and concepts of the present disclosure. Therefore, although language of the present disclosure may describe methods, steps, concepts, systems, and the like in relation to a limited subset of such associated terms, such descriptions are for illustrative purposes and are not to be construed as limiting to the present disclosure. For example, descriptions such as being "based on", "next to", and the like in relation to a fault 210 may additionally be applicable to a testing location 202, a boundary 214, or another element that is associated with such a fault 210. In this regard, elements and terms may be associated with each other such that reference to one may mean a reference to another, generally and particularly. In another example, a phrase such as "N-detect parameter of a fault" may mean "N-detect parameter of a testing location".

In embodiments, multiple faults 210 may be associated with the same testing location 202. For example, an open circuit fault and a closed-circuit fault may be so close as to be considered in the same area and such an area may be determined to be a single "testing location" and be assigned an N-detect parameter. Such an N-detect parameter may be a sum of the N-detect parameters of all faults 210 associated with such a testing location 202.

In a step 308, a plurality of weighting are determined based on the plurality of N-detect parameters. In embodiments, the weighting parameters may be associated with the testing locations 202 and used to generate a defect criticality of defects 208 that are nearby. In embodiments, a controller 122 of a screening system 100 determines the weighting parameters using the processor 124 and stores the weighting parameters on memory 126.

Various methods may be utilized to determine weighting parameters such as, but not limited to, methodologies utilizing binning methods, algorithmic equations, machine learning models, and any other methodologies known in the art applicable to using N-detect parameters.

For example, determining and assigning such weighting parameters may include binning the faults 210 by their respective N-detect parameters and then assigning weighting parameters (e.g., weight values) to each fault 210 in a bin. For instance, one schema is to assign testing locations 202 and/or faults 210 with an N-detect parameter of 1 or less to a first bin, with an N-detect parameter of 2 through 5 to a second bin, with an N-detect parameter of 6 through 10 to a third bin, and with an N-detect parameter of 11 or more to a fourth bin. Next, for instance, each testing location 202 in the first bin could be assigned a first weighting parameter, each testing location 202 in the second bin could be assigned a second weighting parameter, and so forth. In this regard, weighting parameters could be efficiently assigned collectively to each bin and be associated with their respective bins.

In another example, algorithmic equation methods may be utilized to determine weighting parameters. Nonlimiting examples of weighting parameter equations include the weighting parameter being equal to 1/(N-detect parameter), 1−(N-detect parameter), and/or the like. For at least these examples, a lower N-detect parameter results in a higher weighting parameter. In this regard, the determining the plurality of weighting parameters of step 308 may be based on an inverse relationship schema such that weighting parameters associated with N-detect parameters that are relatively low are determined to be relatively high. In embodiments, due to a configuration (e.g., stored algorithm) of the screening system 100, a higher weighting parameter results in a higher defect criticality for nearby defects, which may be indicative of more importance and/or more likelihood of being a test escape defect. In this regard, a low N-detect parameter such as 1 corresponding to only being tested once may, for example, lead to nearby defects being weighted more heavily.

In another example, weighting parameters may be determined via a machine learning model module (not shown). For example, in a method using one or more bins of testing locations 202, a machine learning model may be configured to determine the bins. In another example, a machine learning model may be configured to optimize the weighting parameters associated with the bins. For instance, such a step may be performed during a device qualification phase when much higher numbers of tests are typically performed, in conjunction with burn-in testing and other activities that generate accelerated failure test results 118. In some cases, a dedicated test device sample may be used to establish the which weighting parameter values should be associated with which bins for a particular type of sample and then fine-tuned for a product sample. For example, a test device sample may be a sample that is rigorously tested for faults so that a correlation between N-detect parameters of faults 210 and nearby defects 208 may be better understood and statistically modeled. Such statistical models may be used to determine appropriate weighting parameters associated with N-detect parameters. As an illustrative example that is not necessarily an accurate description of a correlation, it may be shown that all N-detect parameter values over 100 have diminishing returns in predicting defect criticality and as such, should be binned and weighted equally.

In a step 310, a defect criticality for a defect 208 is generated based on at least: a proximity 220 between the plurality of testing locations 202 and the defect location of the defect 208; and the plurality of weighting parameters. In embodiments, any system may generate the defect criticality. For example, a controller 122 of the screening system 100 may generate the defect criticality 232 using the processor 124 and store the defect criticality on memory 126.

In embodiments, any method may be used to determine a proximity 220. Referring back to FIG. 2C, in embodiments, the proximity 220 is generally a metric indicative of a distance between two elements, but is not necessarily equal to such a distance.

For example, the proximity 220 may be, but is not limited to, a binary determination of whether a defect 208 is close enough to a fault 210. For instance, if such a binary determination is negative (i.e., the defect 208 is far away from the fault 210), then the controller 122 may be configured to ignore those N-detect parameters. In another example, the proximity 220 is a value (e.g., 10 microns) indicative of a distance. In another example, generating the defect criticality may be based on an intersection 216 of a proximity boundary 222 with the boundaries 214.

In other examples, the proximity 220 may be based on a threshold such that boundaries 214 causing an intersection 216 with a proximity boundary 222 of a defect 208 may be considered when determining the weighting parameter 230, and boundaries 214 associated with N-detect parameters outside such a proximity boundary 222 are not considered in such a determination. For example, as shown in FIG. 2C, the proximity boundary 222 may be determined by a radius 218 (e.g., which may be referred to as an "overlay radius") or any other geometric rules. For example, the proximity boundary 222 may be determined by a user. For instance, the proximity boundary 222 may be selected by a user to be suitable for a point-based defect 208. In embodiments, a case study may be performed or analyzed to determine how far away defects 208 may be and still cause a fault 210, and such a distance may be used to determine the proximity boundary 222. In embodiments, the proximity boundary 222 and/or radius 218 is large enough to allow for margin of error to account for inaccuracies in measuring sub-systems (e.g., inspection sub-system) but small enough that the statistical probability of false-positives (e.g., wrongly weighting a defect 208 based on a far away, irrelevant fault 210) is low.

In embodiments, boundaries 214 of testing locations 202 may be determined via a variety of methodologies. In embodiments, as shown in FIG. 2A, the testing location areas 212 and boundaries 214 of electrical short faults 210 are based on, for example, net pair combinations of features 224a, 224b. For example, testing location areas 212 may be defined by geometric proximity rules for each potential adjacent net pair combination of features 224a, 224b for structural tests based on stuck-at and/or transition-delay fault models. For instance, proximity rules for shorts may be configured to define the testing location area 212 as the area between the two closest edges of two nearby features 224a, 224b with an added margin to expand such an area. In this regard, such fault models may model for short circuiting between features 224a, 224b.

In embodiments, the testing location areas 212 and boundaries 214 of faults 210 that are electrically open faults (not shown) are based on a single feature, contact, via, or interconnect. For example, open faults may be defined using geometric rules for electrically open faults for stuck-at and transition-delay fault models based on a perimeter (e.g., a perimeter with or without added margin) of a single feature, contact, via, or interconnect.

Figure 4:
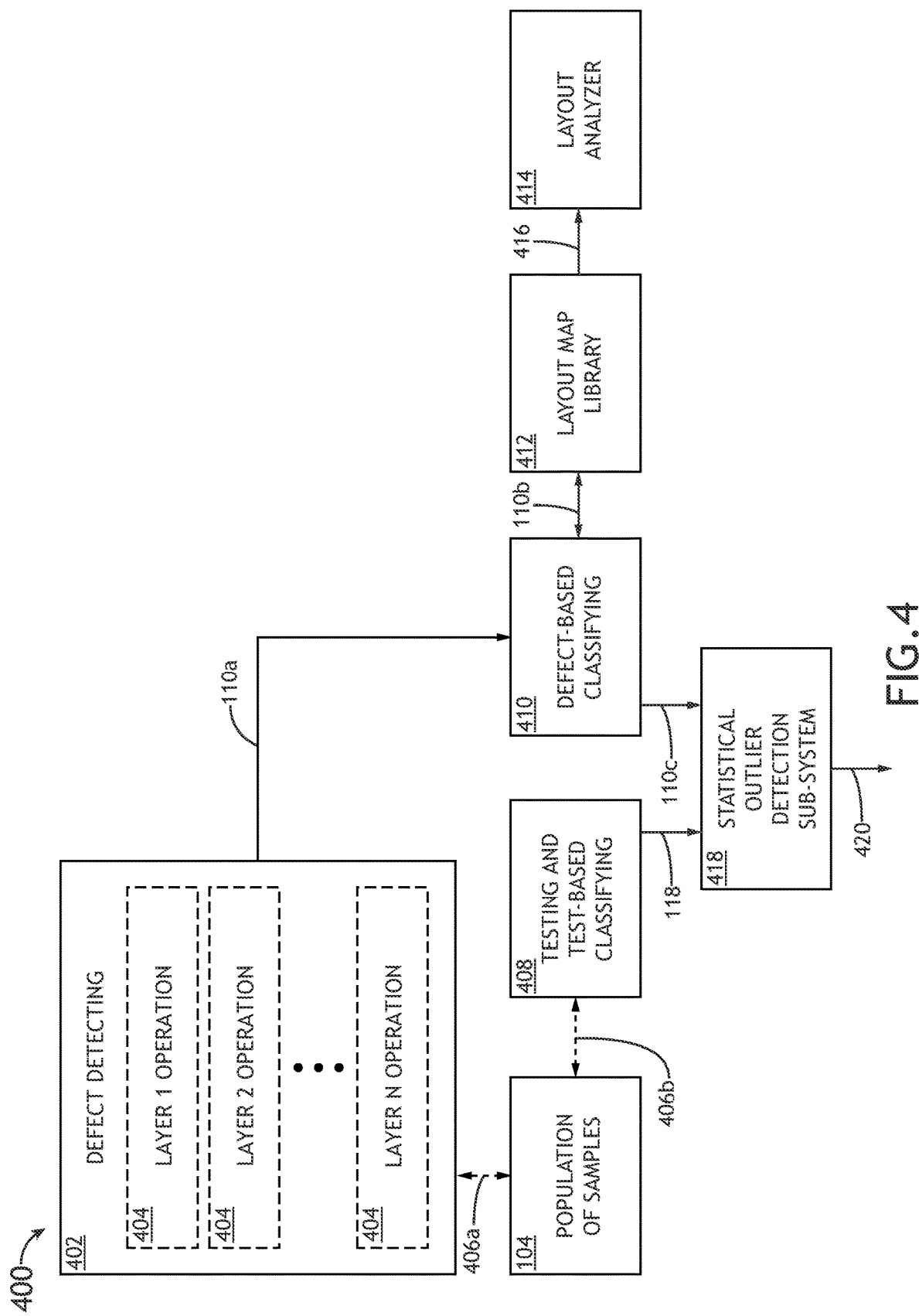
FIG. 4 illustrates a flow diagram depicting a method for generating a defect criticality of a defect via a screening system, in accordance with one or more embodiments of the present disclosure.

FIG. 4 illustrates a flow diagram depicting a method 400 for generating a defect criticality of a defect 208, in accordance with one or more embodiments of the present disclosure.

In a defect detecting step 402, defects may be detected, in accordance with one or more embodiments. For example, referring back to FIG. 3, defect detecting step 402 may include step 302, or vice versa. In embodiments, data from step 402 is aggregated before and/or after a defect-based classifying step 410. In embodiments, 100 percent of dies are screened at a defect detecting step 402.

In embodiments, data 110a from the defect detecting step 402 may be raw sensor data and/or at least partially processed/aggregated data indicative of a number of defects detected, classified, characterized, and/or the like. Such raw and/or processed data 110a may be used in an optional defect-based classifying step 410 to generate defect results 110b. For example, a defect-based classifying step 410 may be used to generate defect results 110b via a defect classifier such as an I-PAT defect classifier. Such defect results 110b may be defect results 110.

In embodiments, the defect detecting step 402 occurs during, before, or after multiple layer operations 404 (e.g., lithography, etching, aligning, joining, or the like) at critical manufacturing steps of the sample 104. In this regard, the defect detecting step 402 at various stages of the manufacturing process may be referred to as inline defect detection.

The defect detecting step 402 may be performed using any system known in the art such as a characterization sub-system 112. For example, samples 104 may be screened using an inline defect inspection sub-system 128 and a metrology sub-system 130. Note that the metrology sub-systems 130 may not necessarily be used to directly image defects, but data therefrom (e.g., film thicknesses, etc.) may be used in the defect detecting step 402 to improve the accuracy of defect detection and characterization.

In embodiments, defect results 110 may be passed to a layout map library 412 as shown by defect results 110b in FIG. 4. In embodiments, the layout map library 412 receives, stores, and/or aggregates the defect results 110b and may include other data. For example, the layout map library 412 may store a layout map (e.g., layout map 206 of FIG. 2A). In some examples, a layout map 206 is a table of values stored on memory 126. In embodiments, the layout map library 412 may be referred to as a "Die Layout N-Detect Bin Map Library."

In embodiments, layout map library data 416 (e.g., layout map 206 with defect results 110b) may be received by a layout analyzer 414. In embodiments, the layout analyzer 414 is a module. In embodiments, the layout analyzer 414 may perform one or more analysis and/or operations relating to the layout map 206 or any other data that is received. For example, the layout analyzer 414 may bin the faults 210 and/or associated testing locations 202 in one or more bins based on respective N-detect parameter values and then apply a respective weighting parameter to each bin.

In embodiments, the layout analyzer 414 may analyze layout map library data 416 to determine various elements of layout map 206 of FIG. 2A. For example, the layout analyzer 414 may be configured to determine boundaries 214, proximity boundaries 222, and the like. In some examples, the layout analyzer 414 may be configured to determine the proximity 220 of a defect 208 based on the layout map 206.

In embodiments, defect results 110b modified by the layout analyzer 414 may be passed from a layout map library 412 back to a defect-based classifying step 410. For example, the layout map library 412 and layout analyzer 414 may be used to determine the proximity 220 between defects 208 and faults 210 using the layout map 206 for purposes of determining weighting parameters. For instance, referring back to FIG. 3, determining the proximity used in step 310 and/or determining the plurality of weighting parameters of step 308 may be performed using the layout analyzer 414. Defect results 110b that are passed back to the defect-based classifying step 410 may be modified to include such weighting parameters and/or proximities 220.

In embodiments, the defect-based classifying step 410 may include generating a defect criticality. For example, referring back to FIG. 3, generating the defect criticality of step 310 may be performed at a defect-based classifying step 410. For example, defect results 110b may be modified at the defect-based classifying step 410 to generate modified defect results 110c. For example, modified defect results 110c may include at least one defect criticality and may be passed to a statistical outlier detection sub-system 418.

In embodiments, defect results 110 (e.g., defect results 110a, 110b, and/or 110c) may be based on statistical outlier analysis such as G-PAT, P-PAT, Z-PAT, or the like.

In a testing and test-based classifying step 408, testing and classifying may be performed, in accordance with one or more embodiments. Step 408 may be performed by any test-based tool known in the art. For example, the testing and test-based classifying step 408 may include binning dies based on electrical test results using an electrical test sub-system 132, thereby generating test results 118.

In embodiments, the screening system 100 includes a statistical outlier detection sub-system 418. In embodiments, the test sub-system 114 may output the test results 118 to the statistical outlier detection sub-system 418 and, for example, a defect classifier may output defect results 116c to the statistical outlier detection sub-system 418.

The statistical outlier detection sub-system 418 may perform any analysis on any portion of results received. For example, the statistical outlier detection sub-system 418 may determine or generate output data 420 based on the defect results 110c and test results 118. The output data 420 may be configured to be transmitted anywhere, such as to a system for handling and discarding dies or to a user interface 102 for process monitoring. In one example, such output data 420 may be a sample weighting (e.g., die weighting or die defectivity) indicative of the reliability of one or more samples 104 based on at least the defect criticality of defects of those samples 104. For instance, output data 420 may be outlier data. For example, the statistical outlier detection sub-system 418 may include and/or be configured to perform Z-PAT methodologies. By way of another example, the statistical outlier detection sub-system 418 may include and/or be configured to perform other PAT methodologies or other known statistical outlier determination techniques.

Figure 5:
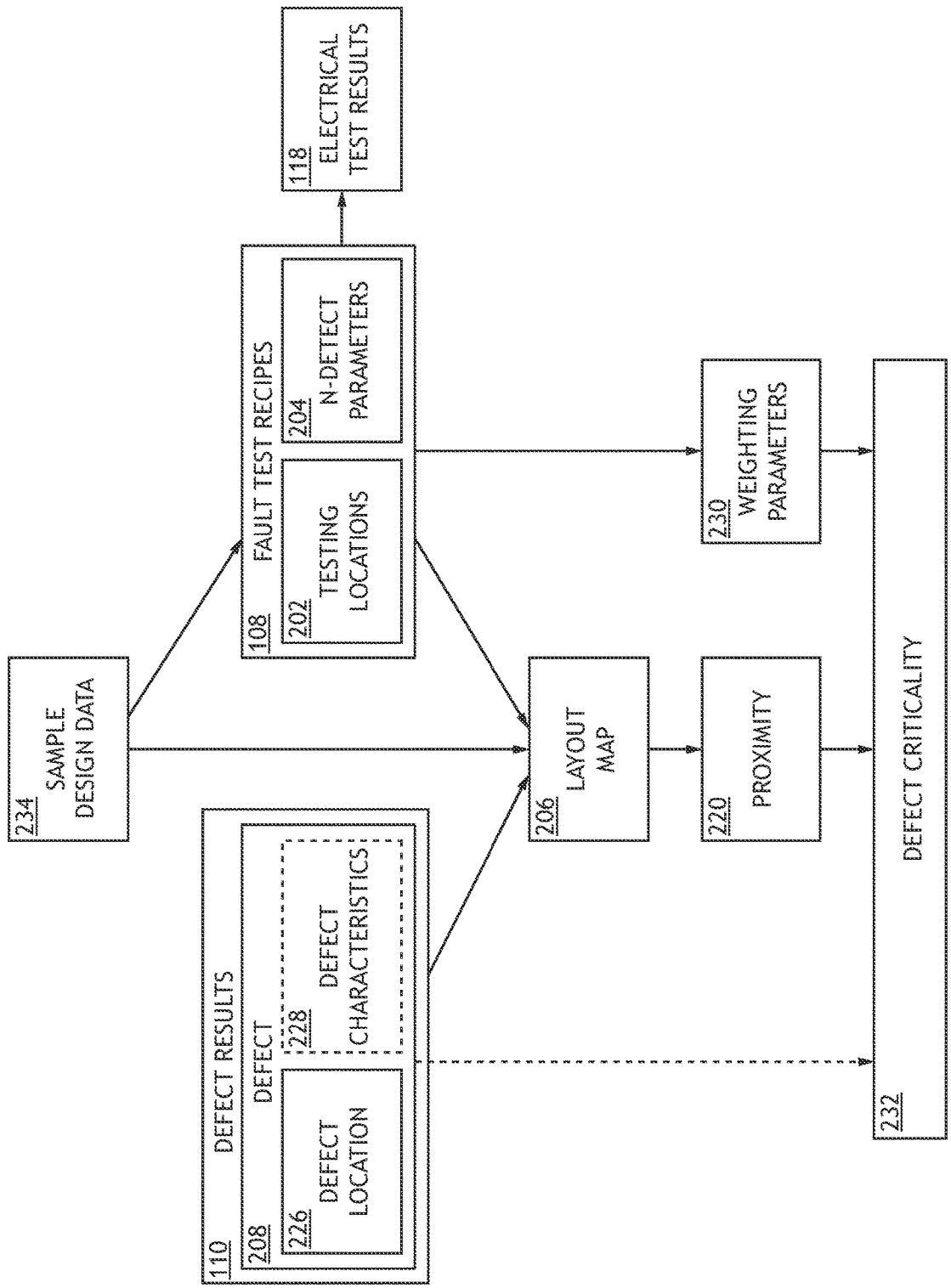
FIG. 5 illustrates a flow diagram of a screening system, in accordance with one or more embodiments of the present disclosure.

FIG. 5 illustrates a flow diagram of a screening system 100, in accordance with one or more embodiments of the present disclosure. Referring back to FIGS. 1-4, for one or more embodiments of the present disclosure, FIG. 5 may be used to conceptually illustrate how some terms may relate to, or be based on, other terms.

For example, as shown in FIG. 5 and referring back to defect criticality of step 310 of FIG. 3, defect criticality 232 may be based on a proximity 220 and weighting parameters 230. In addition, weighting parameters 230 may be based on N-detect parameters 204.

Note that embodiments herein may be used to augment existing defect criticality generating techniques such as defect classifying techniques and/or defect screening techniques. For example, defect criticality 232 may be generated based on other factors besides weighting parameters 230 and proximity 220. For example, as shown in FIG. 5, defect criticality 232 may further be based on defect characteristics 228 such as, but not limited to, defect size, shape, location, critical dimension, and the like. For example, an I-PAT defect classifier system may use weighting parameters 230 as well as defect characteristics 228 to generate a defect criticality 232 of one or more defects 208.

In embodiments, a defect classifier may be an element of or separate from the characterization sub-system 112. For example, the defect classifier may be on the same or different controller as the characterization sub-system 112. The defect classifier may generally, but is not limited to, be configured to provide a variety of "defect-based" results 110 based on characterization sub-system data. For example, an inspection sub-system 128 may be used to determine results corresponding to methods of, but not limited to, detecting, re-detecting, characterizing, and/or categorizing defects. Further, the results of such methods may themselves be further used (e.g., in a defect-based classifying step 410; using the defect classifier; and the like) to perform additional analysis. For example, such results may be used to further analyze one or more die/wafer reliability. For instance, such results may be used for binning dies as acceptable or discardable, and such binning results themselves may be included as part of the defect results 110. For instance, an I-PAT defect classifier may be used to detect/characterize defects and determine binning attributes as disclosed in U.S. Pat. No. 10,761,128, filed on Apr. 5, 2017, entitled "Methods and Systems for Inline Parts Average Testing and Latent Reliability Defect Detection", which is hereby incorporated by reference in its entirety. It is noted that the examples above are for illustrative purposes only, and any defect detection methods and systems may be used to achieve any defect-based results 110.

In embodiments, the layout map 206 may, but is not required to be, based on sample design data 234. For example, a layout map 206 may be generated using a layout extraction sub-system 136 of FIG. 1 using sample design data 234.

Sample design data 234 may generally be any data indicative of the design, layout, or location of features, devices, layers and the like of a sample 104. For example, sample design data 234 may assist in locating otherwise unknown testing locations 202 to, for example, generate a layout map 206. For example, a fault test recipe 108 may reference a component (e.g., transistor, other device, feature, and the like) associated with a fault 210, but not necessarily the testing location 202 of that fault 210. The sample design data 234 may list the same component and its physical location on the sample in a way that can be cross-referenced. For example, in embodiments, the screening system 100 interfaces with layout extraction sub-systems 136 (e.g., but not limited to, Calibre xRC) and ATPG software modules 138 to cross-reference each respective fault (and associated N-detect parameter 204) with a testing location 202. In this regard, testing locations 202 (e.g., X and Y coordinates of testing location 202) may be determined and associated with their respective faults 210 and N-detect parameters 204.

In embodiments, the sample design data 234 is used to generate the fault test recipes 108. For example, an ATPG software module 138 may be used to generate fault test recipes 108 based on sample design data 234 and one or more fault models (e.g., stuck-at fault models or any other fault model used by ATPG software in the industry).

In embodiments, a die defectivity (e.g., output data 420 of FIG. 4) is determined at least partially based on a plurality of defect criticalities that includes the defect criticality 232, where the plurality of defect criticalities is associated with a plurality of layers of the die. For example, multiple weighting parameters 230 of multiple defects 208 at multiple defect locations 226 may be combined to determine an overall die defectivity of a die. The die defectivity may be used to determine whether the die should be removed from the supply chain and discarded.

In embodiments, one or more statistical outliers among a plurality of wafers is identified at least partially based on the weighted defectivity of the die (i.e., die defectivity), where the plurality of wafers includes the die. In embodiments, a portion of the one or more statistical outliers of the plurality of wafers are selectively disqualified from entering a supply chain for a downstream manufacturing process based on a selected risk tolerance level.

For the purpose of the present disclosure, a "module" may mean, but is not limited to, program instructions or a sub-set of program instructions configured to cause one or more processors or other dedicated hardware/circuitry to execute a software application.

In embodiments, the samples 104 may be screened in any order (sequentially and/or in parallel) by any technique, individually, by the lot, once or multiple times, and the like. For example, the samples 104 may be initially screened inline by a characterization sub-system 112—as shown by material flow 406a of FIG. 4—at multiple critical manufacturing steps of the multiple layers of the population of samples 104. Next, for example, at or near the end of the manufacturing process, the population of samples 104 may be screened by the test sub-system 114 to perform one or more electrical tests—as shown by material flow 406b in FIG. 4.

In an optional step, designated areas (e.g., "care areas") could be identified based on N-detect parameters 204. For example, designated areas may be areas of an integrated circuit with low N-detect parameter 204 values. In embodiments, such designated areas may be configured to receive a defect inspection (e.g., high sensitivity inspections such as SEM sub-system inspections). In other examples, defects outside these designated areas may be ignored or weighted less.

Figure 6A:
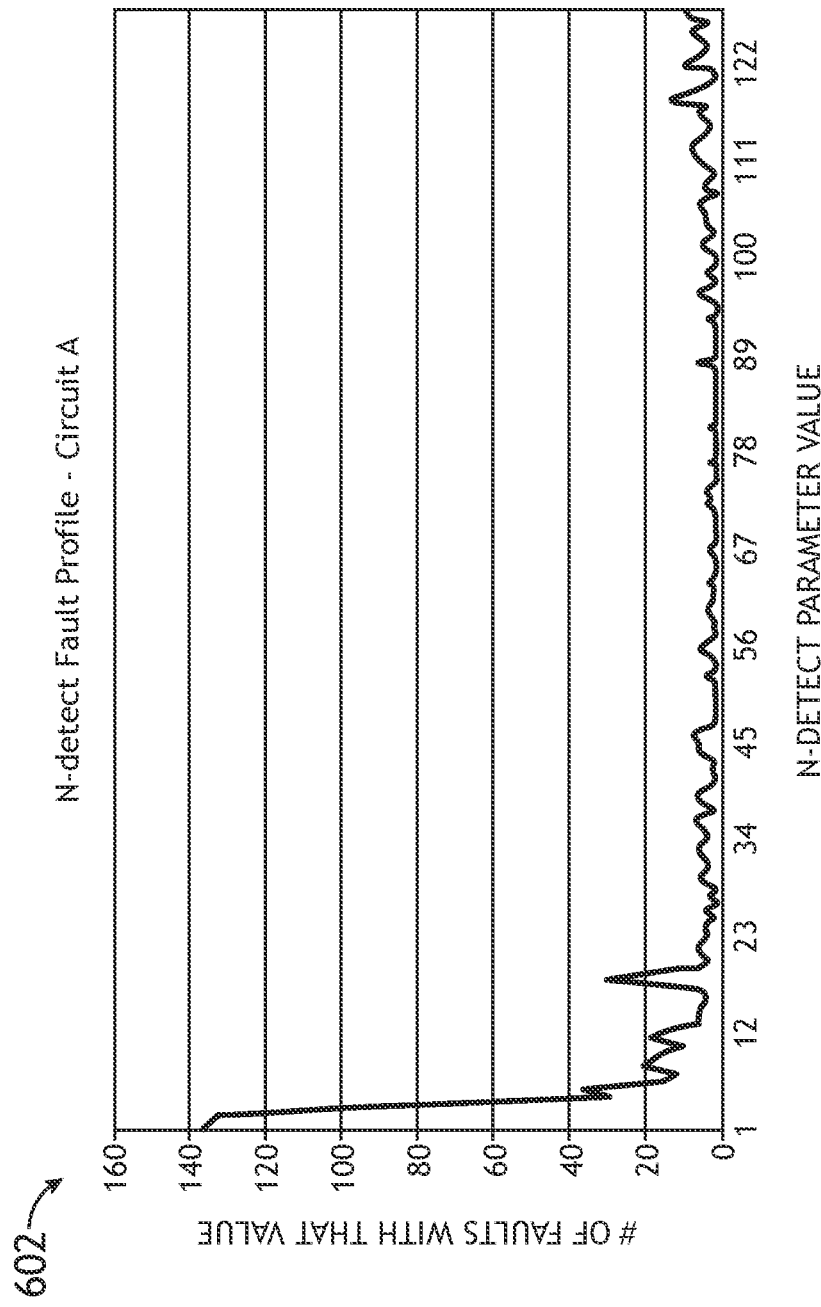
FIG. 6A illustrates a graphical representation of the number of potential faults for each N-detect parameter value for a baseline ATPG stuck-at test pattern of a circuit, in accordance with one or more embodiments of the present disclosure.
Figure 6B:
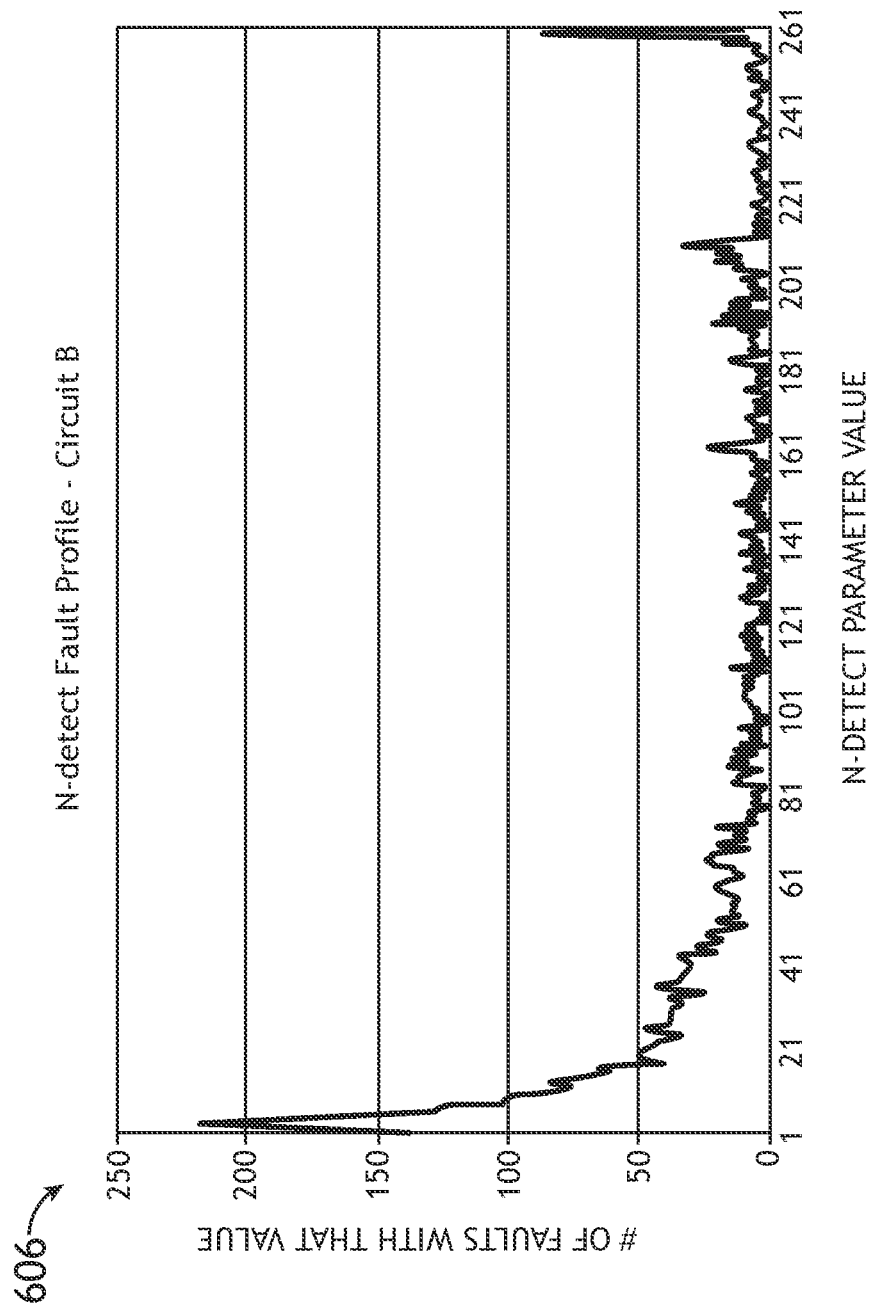
FIG. 6B illustrates a graphical representation of the number of potential faults for each N-detect parameter value for a baseline ATPG stuck-at test pattern of a different circuit, in accordance with one or more embodiments of the present disclosure.

FIGS. 6A and 6B illustrate a variation in N-detect parameter distributions for two circuits using a given fault model. In some circuit designs and fault modeling methodologies, the number of faults which have an N-detect parameter value of only 1 range from 1% to 15% of the total population.

FIG. 6A illustrates graphical representation 602 of the number of potential faults for each N-detect parameter value for a baseline ATPG stuck-at test pattern of Circuit A, in accordance with one or more embodiments of the present disclosure. For example, the N-detect parameter values for each fault may be determined and then, for each N-detect parameter value, the number of faults having such a value may be plotted to generate the graphical representation 602. For example, based on the graphical representation 602, there was roughly 10 or so faults that had a N-detect parameter value of 122. For instance, the fault test recipes for Circuit A may include more than 130 or so fault test recipes, where each fault test recipe tests for one or more faults. In this regard, in embodiments, the same fault test recipe may be common to more than one fault such that a single fault test recipe may increase the N-parameter value of more than one fault.

FIG. 6B illustrates graphical representation 606 of the number of potential faults for each N-detect parameter value for a baseline ATPG stuck-at test pattern of a different Circuit B, in accordance with one or more embodiments of the present disclosure.

Figure 7:
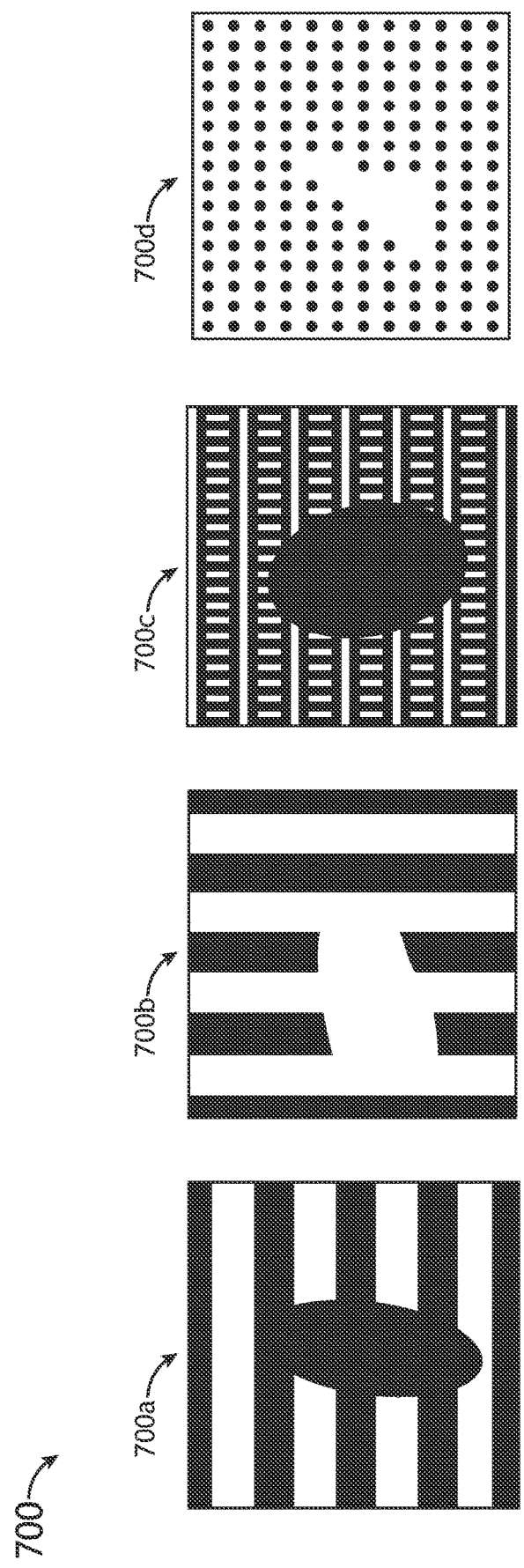
FIG. 7 illustrates a diagrammatic top view of a various simulated test escape defects, in accordance with one or more embodiments of the present disclosure.

FIG. 7 illustrates a diagrammatic top view of various simulated test escape defects 700a, 700b, 700c, and 700d. For example, test escape defects 700 may be open defects that somehow pass all tests but are killer defects.

Figure 8:
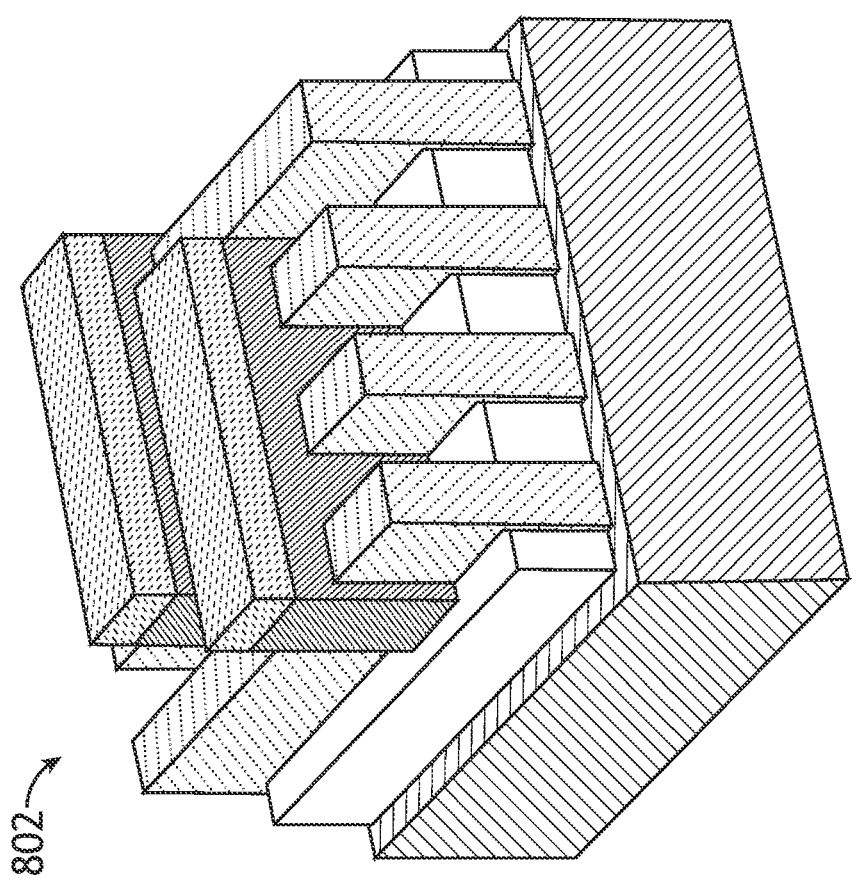
FIG. 8 illustrates an example FinFET transistor cell for cell-aware test (CAT) fault modeling, in accordance with one or more embodiments of the present disclosure.

FIG. 8 illustrates an example FinFET transistor cell 802 for cell-aware fault modeling (e.g., cell-aware test (CAT) fault modeling). In embodiments, cell-aware boundaries may be based on a cell associated with a cell-aware fault. When generating a fault test recipe 108 for a cell-aware fault model of a transistor, an ATPG software module 138 may generally do so based on a defined "cell." For example, the boundary 214 of a fault 210 may be defined to be the boundary of a cell associated with such a fault 210. For instance, in FIG. 8, the boundary may be the footprint/area occupied by the FinFET transistor cell 802. Further, an example defect (not shown) may include a "chip" out of one of the features of a transistor or a short of the features. Cell-aware fault models commonly target leakage defects in FinFETs that force the transistor partially or completely on and drive-strength defects that force the transistor partially or completely off.

Referring again to FIG. 1, in embodiments, the one or more processors 124 of the controller 122 may be communicatively coupled to memory 126, wherein the one or more processors 124 may be configured to execute a set of program instructions maintained in memory 126, and the set of program instructions may be configured to cause the one or more processors 124 to carry out various functions and steps of the present disclosure.

In embodiments, a display of the user interface 102 may be configured to display data of screening system 100 to a user.

It is noted herein that the one or more components of screening system 100 may be communicatively coupled to the various other components of screening system 100 in any manner known in the art. For example, the one or more processors 124 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 122 may be communicatively coupled to one or more components of screening system 100 via any wireline or wireless connection known in the art.

In one embodiment, the one or more processors 124 may include any one or more processing elements known in the art. In this sense, the one or more processors 124 may include any microprocessor-type device configured to execute software algorithms and/or instructions. In one embodiment, the one or more processors 124 may consist of a desktop computer, mainframe computer system, workstation, image computer, parallel processor, or other computer system (e.g., networked computer) configured to execute a program configured to operate the screening system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 124. In general, the term "processor" may be broadly defined to encompass any device having one or more processing elements, which execute program instructions from memory 126. Moreover, different sub-systems of the screening system 100 (e.g., characterization sub-system 112, test sub-system 114, controller 122, user interface 102, and the like) may include processor or logic elements suitable for carrying out at least a portion of the steps described throughout the present disclosure. Therefore, the above description should not be interpreted as a limitation on the present disclosure but merely an illustration.

The memory 126 may include any storage medium known in the art suitable for storing program instructions executable by the associated one or more processors 124 and the data received from the screening system 100. For example, the memory 126 may include a non-transitory memory medium. For instance, the memory 126 may include, but is not limited to, a read-only memory (ROM), a random-access memory (RAM), a magnetic or optical memory device (e.g., disk), a magnetic tape, a solid-state drive and the like. It is further noted that memory 126 may be housed in a common controller housing with the one or more processors 124. In an alternative embodiment, the memory 126 may be located remotely with respect to the physical location of the processors 124, controller 122, and the like. In another embodiment, the memory 126 maintains program instructions for causing the one or more processors 124 to carry out the various steps described through the present disclosure.

In one embodiment, the user interface 102 is communicatively coupled to the controller 122. The user interface 102 may include, but is not limited to, one or more desktops, tablets, smartphones, smart watches, or the like. In another embodiment, the user interface 102 includes a display used to display data of the screening system 100 to a user. The display of the user interface 102 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 102 is suitable for implementation in the present disclosure. In another embodiment, a user may input selections and/or instructions responsive to data displayed to the user via a user input device of the user interface 102. For example, a user may view (or a controller may be configured to display) a weighting parameter or a layout map. In at least one embodiment, the screening system is configured to display a graphical user interface on the user interface 102, where the graphical user interface includes quantitative representations of weighting parameters and/or defect criticality.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems and/or components described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A screening system for generating defect criticality comprising:
   a controller communicatively coupled to one or more sample analysis sub-systems, wherein the one or more sample analysis sub-systems comprise at least one test sub-system and at least one inline characterization sub-system, the controller including one or more processors configured to execute program instructions causing the one or more processors to:
   identify defect results including a defect and a defect location of the defect;
   receive fault test recipes, wherein each fault test recipe is configured to test one or more of a plurality of potential faults at a plurality of testing locations; and
   identify a plurality of N-detect parameters, wherein each N-detect parameter of the plurality of N-detect parameters is associated with a testing location of a potential fault of the plurality of potential faults and is based on a countable number of times the fault test recipes are configured to test the potential fault;
   determine a plurality of weighting parameters based on the plurality of N-detect parameters, wherein the plurality of weighting parameters are associated with the plurality of testing locations;
   generate the defect criticality for the defect based on at least:
   a proximity between the plurality of testing locations of the plurality of potential faults and the defect location of the defect; and
   the plurality of weighting parameters associated with the plurality of testing locations.

2. The screening system of claim 1, wherein the receiving the fault test recipes comprises generating a layout map of the plurality of testing locations, wherein the generating the defect criticality for the defect is further based on the layout map.

3. The screening system of claim 1, wherein the one or more processors are further configured to execute the program instructions causing the one or more processors to:
bin the plurality of testing locations into a plurality of bins based on the plurality of N-detect parameters, wherein the plurality of weighting parameters are further based on, and associated with, the plurality of bins.

4. The screening system of claim 1, wherein the identifying the defect results is performed via an inline characterization sub-system of the one or more sample analysis sub-systems.

5. The screening system of claim 1, wherein each of the plurality of testing locations includes a testing location area of a plurality of testing location areas, wherein the receiving the plurality of testing locations comprises:
determining boundaries of the plurality of testing location areas.

6. The screening system of claim 5, wherein the one or more processors are further configured to execute the program instructions causing the one or more processors to:
determine a proximity boundary associated with the defect.

7. The screening system of claim 6, wherein the generating the defect criticality is further based on an intersection of the proximity boundary with the boundaries.

8. The screening system of claim 5, wherein the determining the boundaries of the plurality of testing location areas comprises determining a short circuit boundary based on a pair of adjacent features associated with a potential short circuit fault of the plurality of potential faults.

9. The screening system of claim 5, wherein the determining the boundaries of the plurality of testing location areas comprises determining an open circuit boundary based on a feature associated with a potential open circuit fault of the plurality of potential faults.

10. The screening system of claim 5, wherein the determining the boundaries of the plurality of testing location areas comprises determining a cell-aware boundary based on a cell associated with a cell-aware potential fault of the plurality of potential faults.

11. The screening system of claim 1, wherein the determining the plurality of weighting parameters is performed via a machine learning model.

12. The screening system of claim 1, wherein the determining the plurality of weighting parameters is based on an inverse relationship schema such that weighting parameters associated with N-detect parameters that are relatively low are determined to be relatively high.

13. The screening system of claim 1, wherein the one or more processors are further configured to execute the program instructions causing the one or more processors to:
determine a weighted defectivity for a die at least partially based on a plurality of defect criticalities that includes the defect criticality, wherein the plurality of defect criticalities is associated with a plurality of layers of the die.

14. The screening system of claim 13, wherein the one or more processors are further configured to execute the program instructions causing the one or more processors to:
identify one or more statistical outliers among a plurality of wafers at least partially based on the weighted defectivity of the die, wherein the plurality of wafers includes the die; and
selectively disqualify, based on a selected risk tolerance level, a portion of the one or more statistical outliers of the plurality of wafers from entering a supply chain for a downstream manufacturing process.

15. The screening system of claim 1, wherein the one or more processors are further configured to execute the program instructions causing the one or more processors to:
identify designated areas based on the plurality of N-detect parameters.

16. The screening system of claim 15, wherein the one or more processors are further configured to execute the program instructions causing the one or more processors to:
perform a defect inspection on the designated areas.

17. A method for generating defect criticality comprising:
identifying defect results including a defect and a defect location of the defect;
receiving fault test recipes, wherein each fault test recipe is configured to test one or more of a plurality of potential faults at a plurality of testing locations; and
identifying a plurality of N-detect parameters, wherein each N-detect parameter of the plurality of N-detect parameters is associated with a testing location of a potential fault of the plurality of potential faults and is based on a countable number of times the fault test recipes are configured to test the potential fault;
determining a plurality of weighting parameters based on the plurality of N-detect parameters, wherein the plurality of weighting parameters are associated with the plurality of testing locations;
generating the defect criticality for the defect based on at least:
a proximity between the plurality of testing locations of the plurality of potential faults and the defect location of the defect; and
the plurality of weighting parameters associated with the plurality of testing locations.

18. The method of claim 17, wherein the receiving the fault test recipes comprises generating a layout map of the plurality of testing locations, wherein the generating the defect criticality for the defect is further based on the layout map.

19. The method of claim 17 further comprising:
binning the plurality of testing locations into a plurality of bins based on the plurality of N-detect parameters, wherein the plurality of weighting parameters are further based on, and associated with, the plurality of bins.

20. The method of claim 17, wherein the identifying the defect results is performed via an inline characterization sub-system of the one or more sample analysis sub-systems.

21. The method of claim 17, wherein each of the plurality of testing locations includes a testing location area of a plurality of testing location areas, wherein the receiving the plurality of testing locations comprises:
determining boundaries of the plurality of testing location areas.

22. The method of claim 21 further comprising:
determining a proximity boundary associated with the defect.

23. The method of claim 22, wherein the generating the defect criticality is further based on an intersection of the proximity boundary with the boundaries.

24. The method of claim 21, wherein the determining the boundaries of the plurality of testing location areas comprises determining a short circuit boundary based on a pair of adjacent features associated with a potential short circuit fault of the plurality of potential faults.

25. The method of claim 21, wherein the determining the boundaries of the plurality of testing location areas comprises determining an open circuit boundary based on a feature associated with a potential open circuit fault of the plurality of potential faults.

26. The method of claim 21, wherein the determining the boundaries of the plurality of testing location areas comprises determining a cell-aware boundary based on a cell associated with a cell-aware potential fault of the plurality of potential faults.

27. The method of claim 17, wherein the determining the plurality of weighting parameters is performed via a machine learning model.

28. The method of claim 17, wherein the determining the plurality of weighting parameters is based on an inverse relationship schema such that weighting parameters associated with N-detect parameters that are relatively low are determined to be relatively high.

29. The method of claim 17 further comprising:
determining a weighted defectivity for a die at least partially based on a plurality of defect criticalities that includes the defect criticality, wherein the plurality of defect criticalities is associated with a plurality of layers of the die.

30. The method of claim 29 further comprising:
identifying one or more statistical outliers among a plurality of wafers at least partially based on the weighted defectivity of the die, wherein the plurality of wafers includes the die; and
selectively disqualifying, based on a selected risk tolerance level, a portion of the one or more statistical outliers of the plurality of wafers from entering a supply chain for a downstream manufacturing process.

31. The method of claim 17 further comprising:
identifying designated areas based on the plurality of N-detect parameters.

32. The method of claim 31 further comprising:
performing a defect inspection on the designated areas.

* * * * *